(12) United States Patent
Zou

(10) Patent No.: US 11,711,900 B2
(45) Date of Patent: Jul. 25, 2023

(54) DISPLAY PANEL AND DISPLAY MODULE

(71) Applicant: SHENZHEN CHINA STAR OPTOELECTRONICS SEMICONDUCTOR DISPLAY TECHNOLOGY CO., LTD., Guangdong (CN)

(72) Inventor: Guangnan Zou, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 134 days.

(21) Appl. No.: 17/415,749

(22) PCT Filed: May 18, 2021

(86) PCT No.: PCT/CN2021/094417
§ 371 (c)(1),
(2) Date: Jun. 18, 2021

(87) PCT Pub. No.: WO2022/198773
PCT Pub. Date: Sep. 29, 2022

(65) Prior Publication Data
US 2022/0304173 A1 Sep. 22, 2022

(30) Foreign Application Priority Data

Mar. 22, 2021 (CN) .......................... 202110302532.0

(51) Int. Cl.
*H05K 5/02* (2006.01)
*H05K 5/00* (2006.01)

(52) U.S. Cl.
CPC ......... *H05K 5/0247* (2013.01); *H05K 5/0021* (2013.01)

(58) Field of Classification Search
USPC .......................................... 361/807, 809, 810
See application file for complete search history.

(56) References Cited

U.S. PATENT DOCUMENTS

| | | | |
|---|---|---|---|
| 9,081,552 B1* | 7/2015 | Hall | G09F 9/3023 |
| 10,273,994 B1* | 4/2019 | Foster | G09F 9/3026 |
| 2007/0268203 A1 | 11/2007 | Moriwaki | |
| 2011/0279992 A1* | 11/2011 | Wakimoto | G06F 1/266 |
| | | | 361/807 |

FOREIGN PATENT DOCUMENTS

| | | |
|---|---|---|
| CN | 101567177 A | 10/2009 |
| CN | 206040132 U | 3/2017 |
| CN | 211124829 U | 7/2020 |
| CN | 211928952 U | 11/2020 |
| CN | 211928954 U | 11/2020 |

* cited by examiner

*Primary Examiner* — Hung S. Bui
(74) *Attorney, Agent, or Firm* — The Roy Gross Law Firm, LLC; Roy Gross

(57) ABSTRACT

A display panel and a display module are disclosed. The display panel includes at least one power adapter and at least two sub-display panels. One of the at least two sub-display panels in one row or column is electrically connected to one of the at least one power adapter. Each of the at least two sub-display panels includes a power supply integrated board, and the one of the at least two sub-display panels supplies electricity to an adjacent next sub-display panel by the power supply integrated board.

20 Claims, 7 Drawing Sheets

DISPLAY PANEL AND DISPLAY MODULE

FIELD OF INVENTION

The present disclosure relates to the field of display technologies, and more particularly, to a display panel and a display module.

BACKGROUND OF INVENTION

Current splicing display screens are generally spliced by four sub-display panels arranged in two rows and two columns or sixteen sub-display panels arranged in four rows and four columns. These kinds of splicing screens have advantages of high resolution, rich images, large areas, small sizes, long trouble-free time, and low maintenance costs. However, during installation and use, since a plurality of sub-display panels are required for splicing and each of the sub-display panels needs a separate power supply, each of the sub-display panels needs to be equipped with a separate power supply connecting line and a power plug, thereby often causing power supply methods of the splicing screens to be more complicated. For example, splicing the four sub-display panels needs to use four separate adapters of 220V and at least four power supply connecting lines, and slicing the sixteen sub-display panels needs to use sixteen separate adapters of 220V and at least sixteen power supply connecting lines. When a number of the sub-display panels is large, connections among power supply connecting lines of the sub-display panels disposed in a middle region are complicated, so this kind of power supply method has a certain requirement for a number of power sockets at a place of use, and has security risks.

Therefore, current spliced display screen technologies have problems of each of the sub-display panels needing the separate power supply, a large number of adapters, and complicated connection lines, and need to be improved.

Technical problem: an embodiment of the present disclosure is related to a display panel and a display module, which are configured to solve the problems of each of the sub-display panels needing the separate power supply, the large number of adapters, and the complicated connection lines in current technology.

SUMMARY OF INVENTION

In order to solve the above technical problems, the embodiments of the present disclosure provide technical solutions as follows.

An embodiment of the present disclosure provides a display panel, which includes at least one power adapter and at least two sub-display panels;

wherein, one of the at least two sub-display panels in at least one row or column is electrically connected to one of the at least one power adapter;

each of the at least two sub-display panels includes a power supply integrated board; and the one of the at least two sub-display panels supplies electricity to an adjacent next sub-display panel by the power supply integrated board.

In some embodiments, a number of the at least one power adapter included by the display panel is greater than one.

In some embodiments, the display panel includes the at least one power adapter and the at least two sub-display panels, wherein, each of the at least one power adapter is electrically connected to one of the at least two sub-display panels in each row or column; and each of the at least two sub-display panels includes a first power supply integrated board, the at least two sub-display panels in a same row or column supply electricity to the adjacent next sub-display panel by the first power supply integrated board of the one of the at least two sub-display panels.

In some embodiments, the first power supply integrated board includes a first power supply input port and a first power supply output port, the first power supply input port is electrically connected to a previous sub-display panel in an adjacent row or column, and the first power supply output port is electrically connected to the next sub-display panel in another adjacent row or column.

In some embodiments, a number of the at least one power adapter included by the display panel is one.

In some embodiments, the display panel includes a power adapter and at least four sub-display panels, wherein, the power adapter is electrically connected to one of the at least four sub-display panels in one row or column; and at least one of the at least four sub-display panels includes a first power supply integrated board, at least another one of the at least four sub-display panels includes a second power supply integrated board, and the at least four sub-display panels in a same row or column supply electricity to the adjacent next sub-display panel by the first power supply integrated board or the second power supply integrated board of the one of the at least four sub-display panels.

In some embodiments, each of the at least four sub-display panels in the row or column connected to the power adapter includes the second power supply integrated board, and the second power supply integrated board includes a second power supply input port, a second power supply output port, and a third power supply output port; the second power supply input port of the second power supply integrated board in the one of the at least four sub-display panels is electrically connected to the power adapter, and the second power supply output port of the second power supply integrated board in the one of the at least four sub-display panels is electrically connected to the first power supply input port of the first power supply integrated board of another one of the at least four sub-display panels adjacently in the same row or column; and the third power supply output port of the second power supply integrated board in the one of the at least four sub-display panels is electrically connected to the first power supply input port of the first power supply integrated board of yet another one of the at least four sub-display panels adjacently in a same column or row.

In some embodiments, the display panel includes a power adapter and at least three sub-display panels, wherein, the power adapter is electrically connected to one of the at least three sub-display panels in one row or column; at least one of the at least three sub-display panels includes a first power supply integrated board, at least another one of the at least three sub-display panels includes a second power supply integrated board, and one of the at least three sub-display panels includes a third power supply integrated board; and the at least three sub-display panels in a same row or column supply electricity to the adjacent next sub-display panel by the first power supply integrated board or the second power supply integrated board of another one of the at least three sub-display panels adjacent to the one of the at least three sub-display panels including the third power supply integrated board.

In some embodiments, the third power supply integrated board includes one power supply input port and four power supply output ports, that is, a third power supply input port, a fourth power supply output port, a fifth power supply output port, a sixth power supply output port, and a seventh power supply output port; the third power supply input port of the third power supply integrated board is electrically connected to the power adapter, two of the power supply output ports opposite to each other in the third power supply integrated board are electrically connected to the second power supply input port of two second power supply integrated boards in a previous row and a previous column; and another two of the power supply output ports opposite to each other in the third power supply integrated board are electrically connected to the first power supply input port of two first power supply integrated boards in the previous column and the previous row.

In some embodiments, the third power supply integrated board is disposed in the one of the at least three sub-display panels that is in a center of the display panel, and the first power supply integrated board and the second power supply integrated board are disposed in other sub-display panels surrounding the third power supply integrated board; that is, the first power supply integrated board is disposed in another sub-display panels in the same row or column as the third power supply integrated board, and the second power supply integrated board is disposed in yet another sub-display panels in the same column or row as the third power supply integrated board.

An embodiment of the present disclosure further provides a display module, which includes the display panel, wherein, the display panel includes at least one power adapter and at least two sub-display panels;

wherein, the one of the at least two sub-display panels in at least one row or column is electrically connected to the one of the at least one power adapter;

each of the at least two sub-display panels includes the power supply integrated board; and the one of the at least two sub-display panels supplies electricity to the adjacent next sub-display panel by the power supply integrated board.

In some embodiments, the number of the at least one power adapter included by the display panel is greater than one.

In some embodiments, the display panel includes the at least one power adapter and the at least two sub-display panels, wherein, each of the at least one power adapter is electrically connected to one of the at least two sub-display panels in each row or column; and each of the at least two sub-display panels includes the first power supply integrated board, the at least two sub-display panels in the same row or column supply electricity to the adjacent next sub-display panel by the first power supply integrated board of the one of the at least two sub-display panels.

In some embodiments, the first power supply integrated board includes the first power supply input port and the first power supply output port, the first power supply input port is electrically connected to the previous sub-display panel in an adjacent row or column, and the first power supply output port is electrically connected to the next sub-display panel in another adjacent row or column.

In some embodiments, the number of the at least one power adapter included by the display panel is one.

In some embodiments, the display panel includes the power adapter and at least four sub-display panels, wherein, the power adapter is electrically connected to one of the at least four sub-display panels in one row or column; and at least one of the at least four sub-display panels includes the first power supply integrated board, at least another one of the at least four sub-display panels includes the second power supply integrated board, and the at least four sub-display panels in the same row or column supply electricity to the adjacent next sub-display panel by the first power supply integrated board or the second power supply integrated board of the one of the at least four sub-display panels.

In some embodiments, each of the at least four sub-display panels in the row or column connected to the power adapter includes the second power supply integrated board, and the second power supply integrated board includes the second power supply input port, the second power supply output port, and the third power supply output port; the second power supply input port of the second power supply integrated board in the one of the at least four sub-display panels is electrically connected to the power adapter, and the second power supply output port of the second power supply integrated board in the one of the at least four sub-display panels is electrically connected to the first power supply input port of the first power supply integrated board of another one of the at least four sub-display panels adjacently in the same row or column; and the third power supply output port of the second power supply integrated board in the one of the at least four sub-display panels is electrically connected to the first power supply input port of the first power supply integrated board of yet another one of the at least four sub-display panels adjacently in the same column or row.

In some embodiments, the display panel includes the power adapter and at least three sub-display panels, wherein, the power adapter is electrically connected to one of the at least three sub-display panels in one row or column; wherein at least one of the at least three sub-display panels includes the first power supply integrated board, at least another one of the at least three sub-display panels includes the second power supply integrated board, and one of the at least three sub-display panels includes the third power supply integrated board; and the at least three sub-display panels in the same row or column supply electricity to the adjacent next sub-display panel by the first power supply integrated board or the second power supply integrated board of another one of the at least three sub-display panels adjacent to the one of the at least three sub-display panels including the third power supply integrated board.

In some embodiments, the third power supply integrated board includes one power supply input port and four power supply output ports, that is, the third power supply input port, the fourth power supply output port, the fifth power supply output port, the sixth power supply output port, and the seventh power supply output port; the third power supply input port of the third power supply integrated board is electrically connected to the power adapter, two of the power supply output ports opposite to each other in the third power supply integrated board are electrically connected to the second power supply input port of two second power supply integrated boards in the previous row and the previous column; and another two of the power supply output ports opposite to each other in the third power supply integrated board are electrically connected to the first power supply input port of two first power supply integrated boards in the previous column and the previous row.

In some embodiments, the third power supply integrated board is disposed in the one of the at least three sub-display panels that is in the center of the display panel, and the first power supply integrated board and the second power supply integrated board are disposed in other sub-display panels surrounding the third power supply integrated board; that is, the first power supply integrated board is disposed in another sub-display panels in the same row or column as the third power supply integrated board, and the second power supply integrated board is disposed in yet another sub-display panels in the same column or row as the third power supply integrated board.

Beneficial effect: in the display panel and the display module provided by the embodiments of the present disclosure, the display panel includes the at least one power adapter and the at least two sub-display panels. One of the at least two sub-display panels in at least one row or column is electrically connected to one of the at least one power adapter. Each of the at least two sub-display panels includes the power supply integrated board, two adjacent sub-display panels are electrically connected to each other by the power supply integrated board, and a same electrical current signal is input to the two sub-display panels in adjacent rows/columns, thereby supplying electricity to adjacent sub-display panels. This structural design can greatly reduce a number of power adapters used, thereby simplifying power supply wirings of splicing screens, improving safety of using the splicing screens, and saving costs.

DETAILED DESCRIPTION OF PREFERRED EMBODIMENTS

Figure 1:
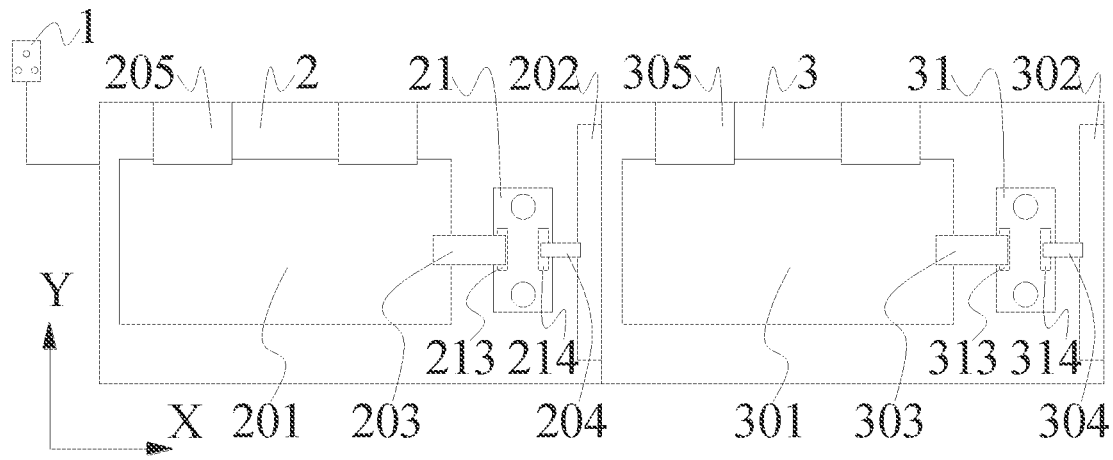
FIG. 1 is a schematic structural diagram of a first display panel according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

The embodiments of the present disclosure provide a display panel and a display module. For details, refer to FIGS. 1 to 12.

Current splicing display screens are generally spliced by four sub-display panels arranged in two rows and two columns or sixteen sub-display panels arranged in four rows and four columns. During installation and use, since a plurality of sub-display panels are required for splicing and each of the sub-display panels needs a separate power supply, each of the sub-display panels needs to be equipped with a separate power supply connecting line and a power plug, thereby often causing power supply methods of the splicing screens to be more complicated. For example, splicing the four sub-display panels needs to use four separate adapters of 220V and at least four power supply connecting lines, and slicing the sixteen sub-display panels needs to use sixteen separate adapters of 220V and at least sixteen power supply connecting lines. When a number of the sub-display panels is large, connections among power supply connecting lines of the sub-display panels disposed in a middle region are complicated, so this kind of power supply method has a certain requirement for a number of power sockets at a place of use, and has security risks. Therefore, the embodiments of the present disclosure provide the display panel and the display module to solve the problems above.

An embodiment of the present disclosure provides the display panel, which includes at least one power adapter and at least two sub-display panels. One of the at least two sub-display panels in at least one row or column is electrically connected to one of the at least one power adapter; and each of the at least two sub-display panels includes a power supply integrated board, and the one of the at least two sub-display panels supplies electricity to an adjacent next sub-display panel by the power supply integrated board.

It can be understood that in order to reduce a number of power adapters 1 used, the present disclosure disposes one power supply integrated board in each sub-display panel. Two adjacent sub-display panels are connected in parallel by their power supply integrated boards. A number of the sub-display panels connected in parallel is at least two, and includes, but is not limited to, more than two. Specifically, the power supply integrated boards of the two adjacent sub-display panels are connected to each other by a power supply wiring 11. In each of the sub-display panels, a power supply input port and a power supply output port of the power supply integrated board are connected to each other by a first power supply line 111 and a second power supply line 112, and the first power supply line 111 and the second power supply line 112 output electricity with different polarities in the power adapters 1, respectively, thereby allowing electrical potentials of the power supply input port and the power supply output port in each of the sub-display panels to be same. Therefore, the two adjacent sub-display panels form a parallel circuit, which allows the sub-display panels connected in parallel to be able to obtain electricity at a same time without disposing one power adapter 1 in each of the sub-display panels. Therefore, requirements of external environment when using the splicing screens are greatly reduced, costs are saved, and uses of the splicing screens can be wider.

Wherein, at least one power supply integrated board is connected to an external AC voltage, and the external AC voltage generally adopts 220V of AC voltage.

Further, each of the sub-display panels includes the power supply integrated board, and the power supply integrated board includes the power supply input port, the power supply output port, the first power supply line 111, and the second power supply line 112.

Figure 3:
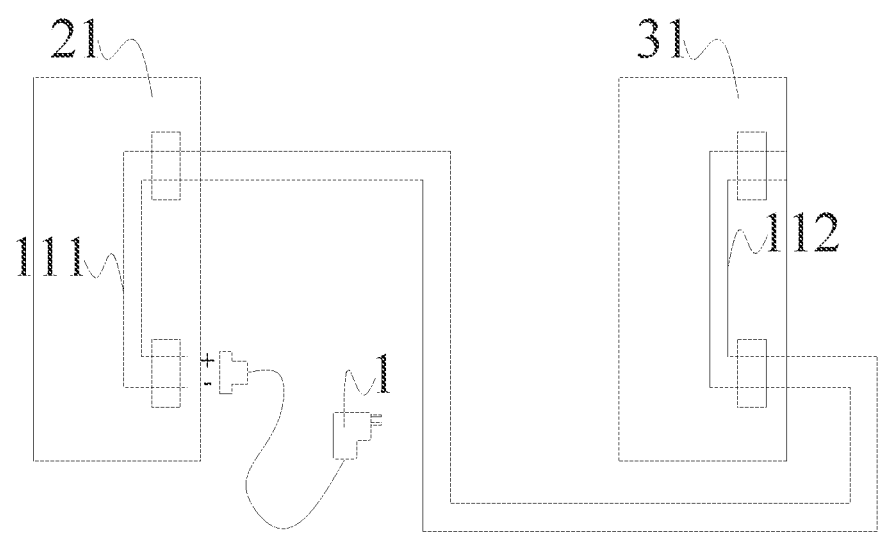
FIG. 3 is a schematic connecting diagram of power supply lines among adjacent sub-display panels according to an embodiment of the present disclosure.

Further, referring to FIG. 3, FIG. 3 is a schematic connecting diagram of power supply lines among adjacent sub-display panels according to an embodiment of the present disclosure. Each of the sub-display panels further includes the power supply wiring 11, and the first power supply line 111 and the second power supply line 112 at the power supply input port of at least one of the sub-display panels are electrically connected to the first power supply line 111 and the second power supply line 112 at the power supply output port of an adjacent sub-display panel by the power supply wiring 11, respectively.

Further, referring to FIG. 1, FIG. 1 is a schematic structural diagram of a first display panel according to an embodiment of the present disclosure. Each of the sub-display panels further includes a first electrical component 201 and a second electrical component 202, and the power supply integrated board thereof further includes a first power supply port 213 and a second power supply port 214 electrically connected to the power supply input port of the power supply integrated board, respectively. The first power supply port 213 is electrically connected to the first electrical component 201, and the second power supply port 214 is electrically connected to the second electrical component 202.

The first electrical component 201 includes a circuit board, and the second electrical component 202 includes a backlight module. The first electrical component 201 is electrically connected to a first sub-display panel 2 by a chip on film (COF) 205, the first power supply port 213 is electrically connected to the first electrical component 201 by a cable (also called flexible flat cable (FFC) 203, and the second power supply port 214 is electrically connected to the second electrical component 202 by a third power supply line 204.

Further, each of the sub-display panels includes a housing, and the housing has a length direction. The power supply integrated board, the first electrical component 201, and the second electrical component 202 are installed in the housing. The power supply integrated board includes a first side and a second side positioned opposite to each other along the length direction, the first power supply port 213 is located on the first side, and the power supply input port, the power supply output port, and the second power supply port 214 are located on the second side. The first electrical component 201 is far away from the second side and adjacent to the first side, and the second electrical component 202 is far away from the first side and adjacent to the second side.

Further, each of the sub-display panels includes a display portion, a connecting line, and a flexible connecting board. The first electrical component 201 includes the circuit board, the flexible connecting board electrically connects a terminal of the display portion to a terminal of the circuit board, and the flexible connecting board is in a bending state to allow the circuit board to be positioned on a back of the display portion opposite to a light-emitting surface. The connecting line electrically connects a side portion of the circuit board to the first power supply port 213, and a length direction of the circuit board is parallel to a length direction of the sub-display panels.

Similarly, the adjacent sub-display panel further includes a first electrical component 301 and a second electrical component 302, and the power supply integrated board thereof further includes a first power supply port 313 and a second power supply port 314 electrically connected to the power supply input port of the power supply integrated board, respectively. The first power supply port 313 is electrically connected to the first electrical component 301, and the second power supply port 314 is electrically connected to the second electrical component 302. The first electrical component 301 includes another circuit board, and the second electrical component 302 includes another backlight module. The first electrical component 301 is electrically connected to a second sub-display panel 3 by a chip on film (COF) 305, the first power supply port 313 is electrically connected to the first electrical component 301 by a cable (also called flexible flat cable (FFC) 303, and the second power supply port 314 is electrically connected to the second electrical component 302 by a third power supply line 304.

Wherein, power supply integrated boards are divided into first power supply integrated boards, second power supply integrated boards, and third power supply integrated boards according to a number of power supply output ports thereof. Each of the first power supply integrated boards includes one power supply input port and one power supply output port. Each of the second power supply integrated boards includes one power supply input port and two power supply output ports. Each of the third power supply integrated boards includes one power supply input port and four power supply output ports.

In some embodiments, the number of the power adapters included by the display panel is greater than one.

It can be understood that the display panel includes the plurality of sub-display panels, a plurality of the sub-display panels are electrically connected to one of the power adapters, and the number of the power adapters is greater than one.

Further, the display panel includes the at least one power adapter and the at least two sub-display panels, wherein, each of the at least one power adapter is electrically connected to one of the at least two sub-display panels in each row or column; and each of the at least two sub-display panels includes a first power supply integrated board, the at least two sub-display panels in a same row or column supply electricity to the adjacent next sub-display panel by the first power supply integrated board of the one of the at least two sub-display panels.

Specifically, each of the sub-display panels includes the first power supply integrated board, and each first power supply integrated board includes a first power supply input port and a first power supply output port. Wherein, the first power supply input port of one sub-display panel is electrically connected to the first power supply output port of a previous sub-display panel in an adjacent row or column, and the first power supply output port of the sub-display panel is electrically connected to the first power supply input port of the next sub-display panel in another adjacent row or column.

Figure 2:
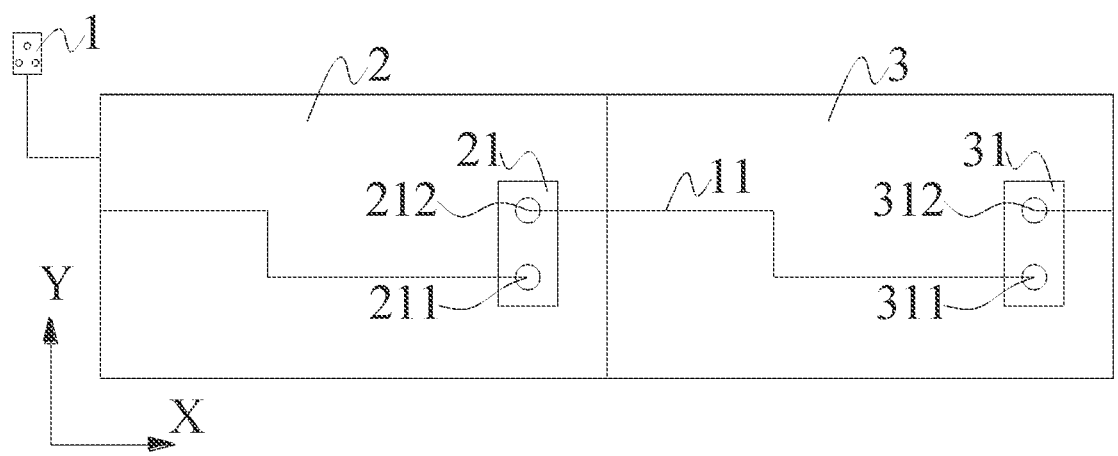
FIG. 2 is a schematic structural diagram of a second display panel according to an embodiment of the present disclosure.

In some embodiments, each of the sub-display panels includes the first power supply integrated board, and the first power supply integrated boards in two of the sub-display panels of the adjacent row or column are connected in parallel. Each of the sub-display panels includes the first power supply integrated board, and each first power supply integrated board includes the first power supply input port and the first power supply output port. The first power supply input port of the sub-display panel is electrically connected to the first power supply output port of the previous sub-display panel in the adjacent row or column, and the first power supply output port of the sub-display panel is electrically connected to the first power supply input port of the next sub-display panel in the another adjacent row or column. Referring to FIG. 2, FIG. 2 is a schematic structural diagram of a second display panel according to an embodiment of the present disclosure. The display panel includes one power adapter 1, one first sub-display panel 2, and one second sub-display panel 3. The first sub-display panel 2 and the second sub-display panel 3 are connected in parallel along a first direction, that is, the first sub-display panel 2 and the second sub-display panel 3 in adjacent columns are horizontally connected in parallel. Further, the first sub-display panel 2 includes one first power supply integrated board 21. The first power supply integrated board 21 includes one first power supply input port 211 and one first power supply output port 212, and the first power supply input port 211 is electrically connected to the power adapter 1. The second sub-display panel 3 includes one first power supply integrated board 31, and the first power supply integrated board 31 includes one first power supply input port 311 and one power supply output port 312. The first power supply input port 311 is electrically connected to the first power supply output port 212 in the first sub-display panel 2, and the first power supply output port 312 is electrically connected to the first power supply input port of the first power supply integrated board of a next column adjacent thereto. In this embodiment, when only the power adapter 1 is used and power of the power adapter 1 is able to meet rated power of each of the sub-display panels, the number of the sub-display panels can be added infinitely along the first direction, thereby greatly reducing the number of the power adapters used and saving the costs.

Wherein, the first direction is a horizontal direction (X direction), that is, a direction in parallel to a display surface of the display panel. A second direction is a vertical direction (Y direction), that is, a direction perpendicular to the display surface of the display panel. The first direction is perpendicular to the second direction.

Figure 4:
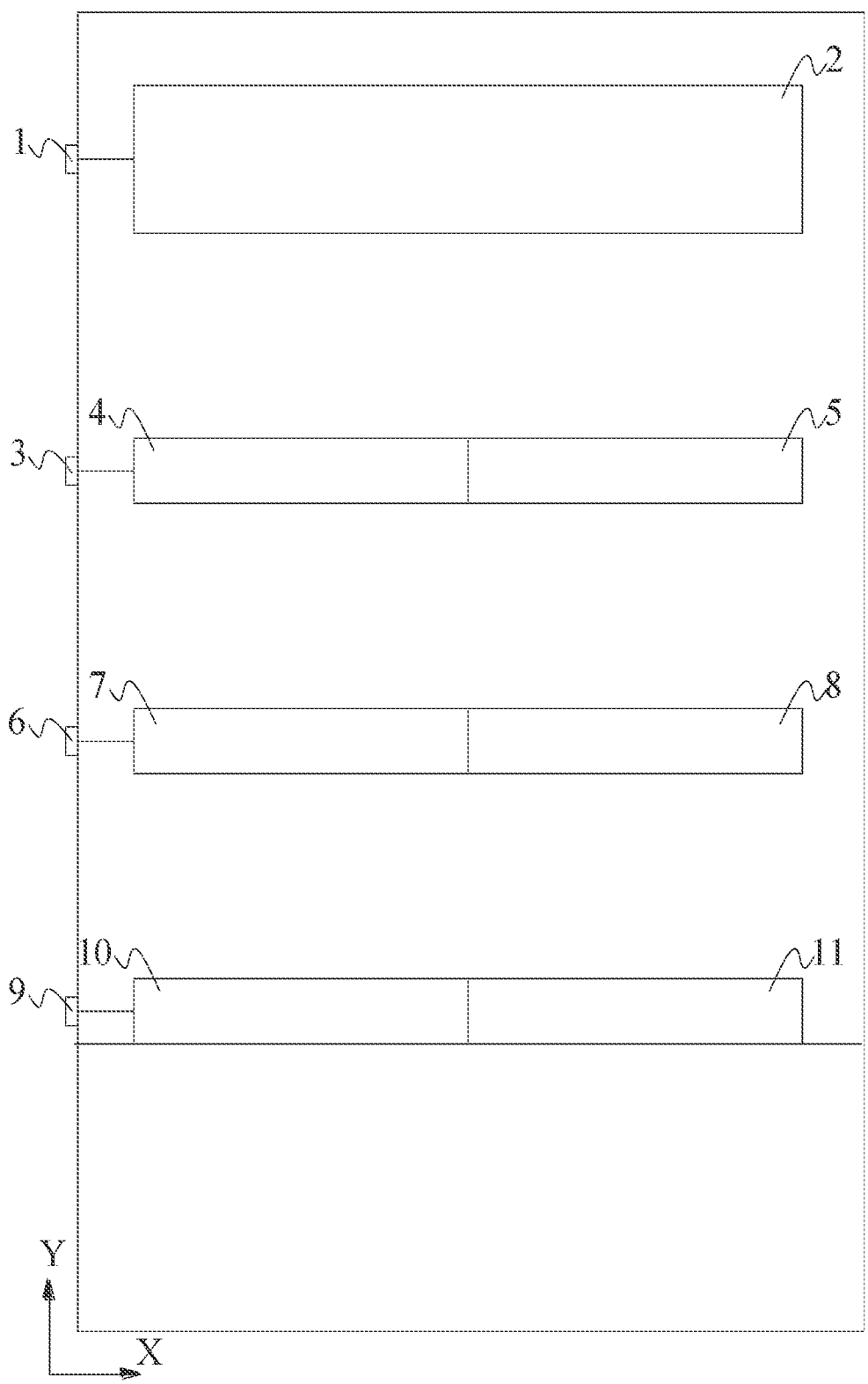
FIG. 4 is a schematic scene diagram of the second display panel according to an embodiment of the present disclosure.

Referring to FIG. 4, FIG. 4 is a schematic scene diagram of the second display panel according to an embodiment of the present disclosure, that is, a schematic structural diagram of a showcase. A structure of the showcase includes one first sub-display panel 2 and a plurality of second sub-display panels, and an area of the first sub-display panel 2 is greater than an area of the second sub-display panels. The first sub-display panel 2 is disposed in an upper position of the showcase, and the first sub-display panel 2 uses a power adapter 1 alone. In a lower position of the showcase, each two of the second sub-display panels are connected in parallel along the first direction and share one power adapter. For example, the second sub-display panel 4 and the second sub-display panel 5 are connected in parallel along the first direction and share the power adapter 3. The second sub-display panel 7 and the second sub-display panel 8 are connected in parallel along the first direction and share the power adapter 6. The second sub-display panel 10 and the second sub-display panel 11 are connected in parallel along the first direction and share the power adapter 9. This splicing method can not only allow each small exhibition area corresponding to each of the second sub-display panels to separately display relevant information of its corresponding product, but can also allow each two of the second sub-display panels to use one power adapter, thereby reducing the number of the power adapters and being more convenient for use of the showcase.

Figure 5:
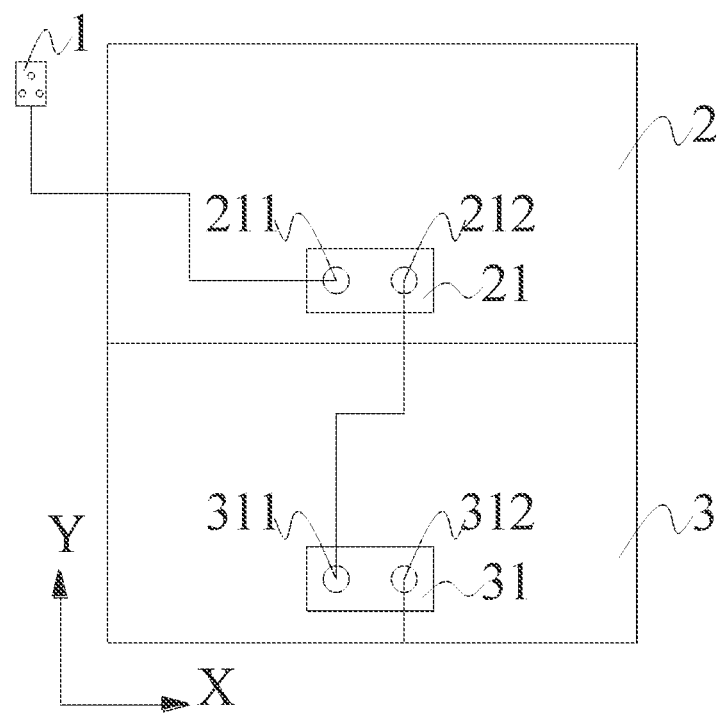
FIG. 5 is a schematic structural diagram of a third display panel according to an embodiment of the present disclosure.

In another embodiment, referring to FIG. 5, FIG. 5 is a schematic structural diagram of a third display panel according to an embodiment of the present disclosure. The display panel includes one power adapter 1, one first sub-display panel 2, and one second sub-display panel 3. The first sub-display panel 2 and the second sub-display panel 3 are connected in parallel along the second direction, that is, the first sub-display panel 2 and the second sub-display panel 3 in adjacent rows are longitudinally connected in parallel. Further, the first sub-display panel 2 includes one first power supply integrated board 21. The first power supply integrated board 21 includes one first power supply input port 211 and one first power supply output port 212, and the first power supply input port 211 is electrically connected to the power adapter 1. The second sub-display panel 3 includes one first power supply integrated board 31, and the first power supply integrated board 31 includes one first power supply input port 311 and one power supply output port 312. The first power supply input port 311 is electrically connected to the first power supply output port 212 in the first sub-display panel 2, and the first power supply output port 312 is electrically connected to the first power supply input port of the first power supply integrated board of a next row adjacent thereto. In this embodiment, when only the power adapter 1 is used and power of the power adapter 1 is able to meet rated power of each of the sub-display panels, the number of the sub-display panels can be added infinitely along the second direction, thereby greatly reducing the number of the power adapters used and saving the costs.

Extended by the two embodiments above, it can be known that the number of the power adapters 1 is equal to a number of rows or a number of columns of the sub-display panels.

Further, when the power supply integrated board and an adjacent power supply integrated board in the next column are connected in parallel along the first direction, the number of the power adapters 1 is equal to the number of rows. when the power supply integrated board and an adjacent power supply integrated board in the next row are connected in parallel along the second direction, the number of the power adapters 1 is equal to the number of columns. Each of the first power supply integrated boards includes one first power supply input port and one first power supply output port. Each first power supply output port is electrically connected to an adjacent first power supply input port of the next column or the next row.

Figure 6:
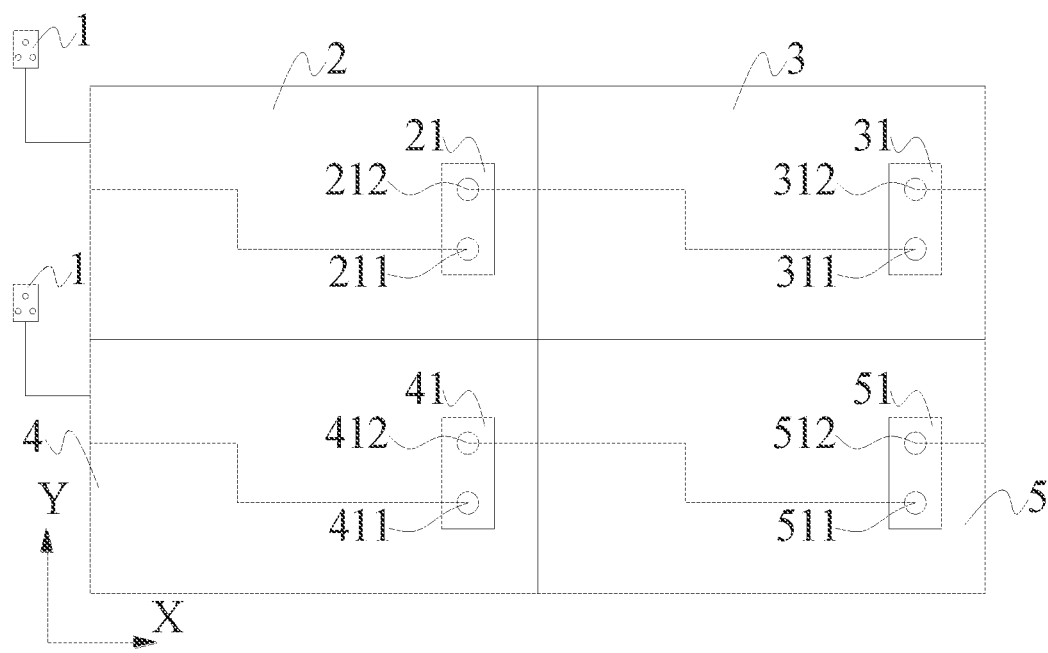
FIG. 6 is a schematic structural diagram of a fourth display panel according to an embodiment of the present disclosure.
Figure 7:
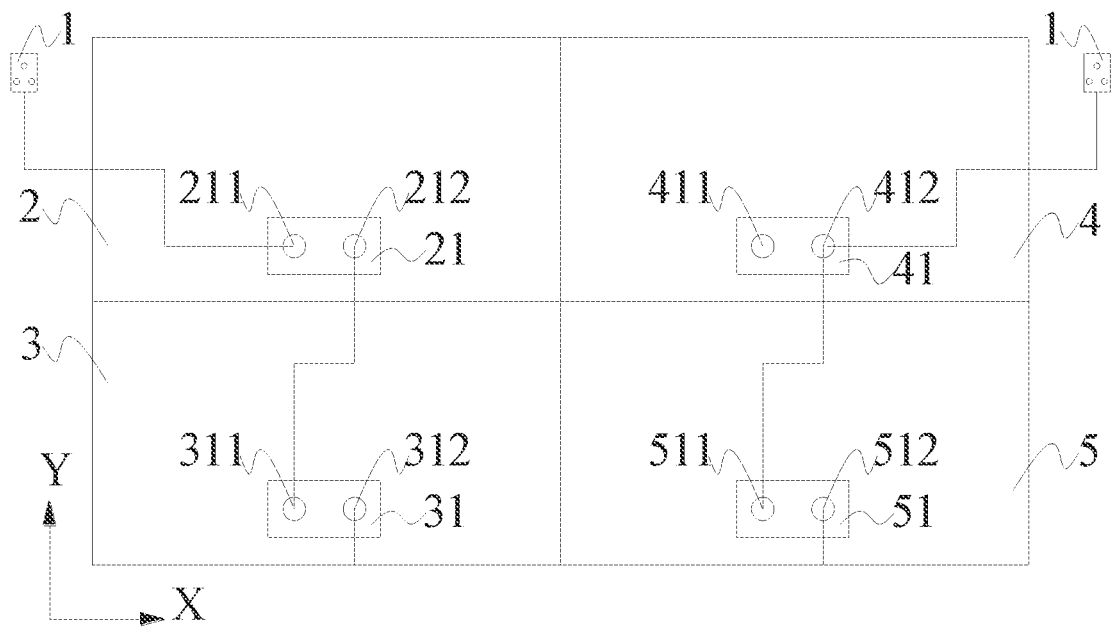
FIG. 7 is a schematic structural diagram of a fifth display panel according to an embodiment of the present disclosure.

Specifically, when a splicing screen having the sub-display panels arranged in the horizontal direction and the vertical direction at a same time is required, in one solution, each of the power adapters 1 may be connected to one end of a first sub-display panel in each row. The number of the power adapters 1 is same as the number of rows of the sub-display panels, and in each row, the first power supply input port in the sub-display panels of next columns and the first power supply output port in the sub-display panels of previous columns are connected in parallel in sequence. Referring to FIG. 6, FIG. 6 is a schematic structural diagram of a fourth display panel according to an embodiment of the present disclosure. The two adjacent sub-display panels are connected in parallel along the first direction, and the number of the power adapters 1 is equal to the number of rows of the sub-display panels. That is, the sub-display panel 2 and the sub-display panel 3 in the adjacent columns are connected in parallel, and the sub-display panel 4 and the sub-display panel 5 in the adjacent columns are connected in parallel. At this time, the number of the power adapters 1 is equal to the number of rows of the sub-display panels, and two power adapters 1 are needed for two rows. Similarly, the numbers of the sub-display panels and the power adapters 1 may also be added along the first direction or the second direction according to actual needs, and it always meets the condition of the number of the power adapters 1 being equal to the number of rows of the sub-display panels. In another solution, each of the power adapters 1 may be connected to the end of the first sub-display panel in each row. The number of the power adapters 1 is same as the number of columns of the sub-display panels, and in each column, the first power supply input port in the sub-display panels of next rows and the first power supply output port in the sub-display panels of previous rows are connected in parallel in sequence. Referring to FIG. 7, FIG. 7 is a schematic structural diagram of a fifth display panel according to an embodiment of the present disclosure. The two adjacent sub-display panels are connected in parallel along the second direction, and the number of the power adapters 1 is equal to the number of columns of the sub-display panels. That is, the sub-display panel 2 and the sub-display panel 3 in the adjacent rows are connected in parallel, and the sub-display panel 4 and the sub-display panel 5 in the adjacent rows are connected in parallel. At this time, the number of the power adapters 1 is equal to the number of columns of the sub-display panels, and two power adapters 1 are needed for two columns. Similarly, the numbers of the sub-display panels and the power adapters 1 may also be added along the first direction or the second direction according to actual needs, and it always meets the condition of the number of the power adapters 1 being equal to the number of columns of the sub-display panels. In the two solutions, since only one power adapter 1 is required for use in each row or each column, the number of the power adapters 1 is greatly reduced, and the costs are saved.

In some embodiments of the present disclosure, the number of the power adapters 1 included by the display panel is one.

It can be understood that when the sub-display panels are used for splicing, the splicing screen provided in the embodiments of the present disclosure may use only one power adapter 1.

In some embodiments, the power supply integrated boards include at least one first power supply integrated board and at least one second power supply integrated board. A number of the first power supply integrated boards is an integral multiple of a number of the second power supply integrated boards. Each of the first power supply integrated boards includes the first power supply input port and the first power supply output port, and each of the second power supply integrated boards includes the second power supply input port, the second power supply output port, and the third power supply output port.

Specifically, the display panel includes one power adapter and at least four sub-display panels, wherein, the power adapter is electrically connected to one of the at least four sub-display panels in one row or column. Wherein, at least one of the at least four sub-display panels includes one first power supply integrated board, at least another one of the at least four sub-display panels includes one second power supply integrated board, and the at least four sub-display panels in the same row or column supply electricity to the adjacent next sub-display panel by the first power supply integrated board or the second power supply integrated board of the one of the at least four sub-display panels.

Each of the at least four sub-display panels in the row or column connected to the power adapter includes the second power supply integrated board, and the second power supply integrated board includes the second power supply input port, the second power supply output port, and the third power supply output port; the second power supply input port of the second power supply integrated board in the one of the at least four sub-display panels is electrically connected to the power adapter, and the second power supply output port of the second power supply integrated board in the one of the at least four sub-display panels is electrically connected to the first power supply input port of the first power supply integrated board of another one of the at least four sub-display panels adjacently in the same row or column; and the third power supply output port of the second power supply integrated board in the one of the at least four sub-display panels is electrically connected to the first power supply input port of the first power supply integrated board of yet another one of the at least four sub-display panels adjacently in a same column or row.

Further, the second power supply input port of the second power supply integrated board in the one of the at least four sub-display panels is electrically connected to the power adapter, the second power supply output port thereof is electrically connected to an adjacent first power supply input port of a next column, the third power supply output port thereof is electrically connected to an adjacent second power supply input port of a next row, and the first power supply output port of the next column is electrically connected to another adjacent first power supply input port of another next column. Or, the second power supply input port of the second power supply integrated board in the one of the at least four sub-display panels is electrically connected to the power adapter, the second power supply output port thereof is electrically connected to an adjacent first power supply input port of a next row, the third power supply output port thereof is electrically connected to an adjacent second power supply input port of a next column, and the first power supply output port of the next column is electrically connected to another adjacent first power supply input port of another next row.

Figure 8:
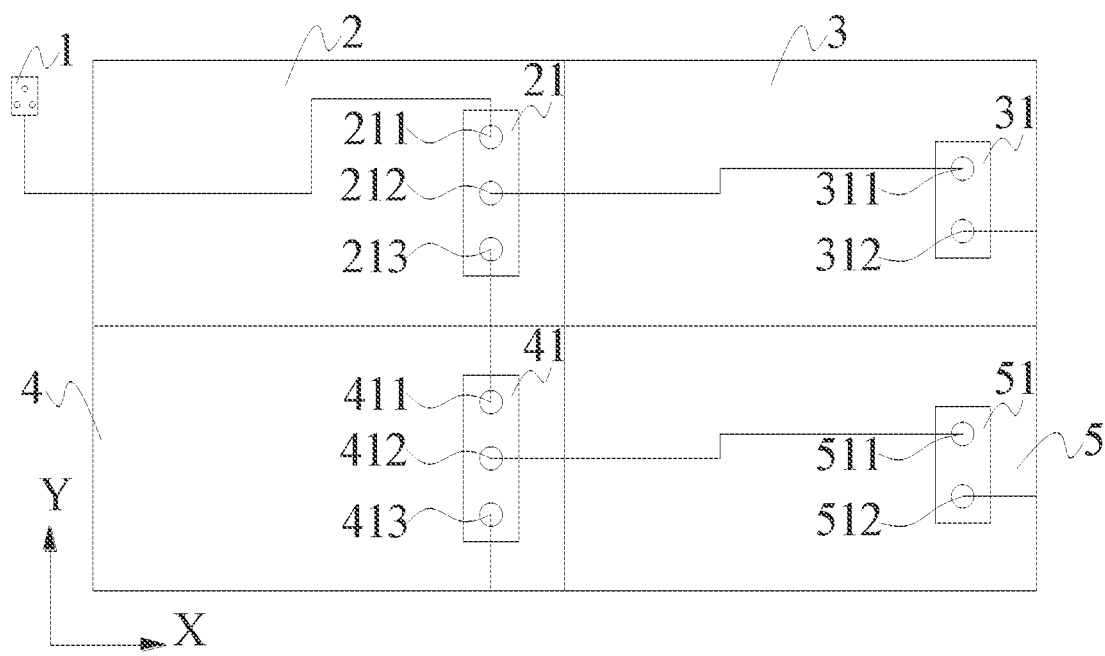
FIG. 8 is a schematic structural diagram of a sixth display panel according to an embodiment of the present disclosure.

In some embodiments, referring to FIG. 8, FIG. 8 is a schematic structural diagram of a sixth display panel according to an embodiment of the present disclosure. The display panel includes one power adapter 1 and four sub-display panels. A sub-display panel 2 and a sub-display panel 4 in a same column include a second power supply integrated board 21 and a second power supply integrated board 41, respectively. A sub-display panel 3 and a sub-display panel 5 in another same column include a first power supply integrated board 31 and a first power supply integrated board 51, respectively. The first power supply integrated board 31 includes a first power supply input port 311 and a first power supply output port 312. The second power supply integrated board 21 includes a second power supply input port 211, a second power supply output port 212, and a third power supply output port 213. The second power supply input port 211 is electrically connected to the power adapter 1, the second power supply output port 212 is electrically connected to the first power supply input port 311 adjacently in a next column, the first power supply output port 312 is electrically connected to another first power supply input port adjacently in another next column, and the third power supply output port 213 is electrically connected to a second power supply input port 411 in a next row. Similarly, a second power supply output port 412 is electrically connected to a first power supply input port 511 adjacently in the next column, and the third power supply output port 413 is electrically connected to another second power supply input port adjacently in another next row.

Figure 9:
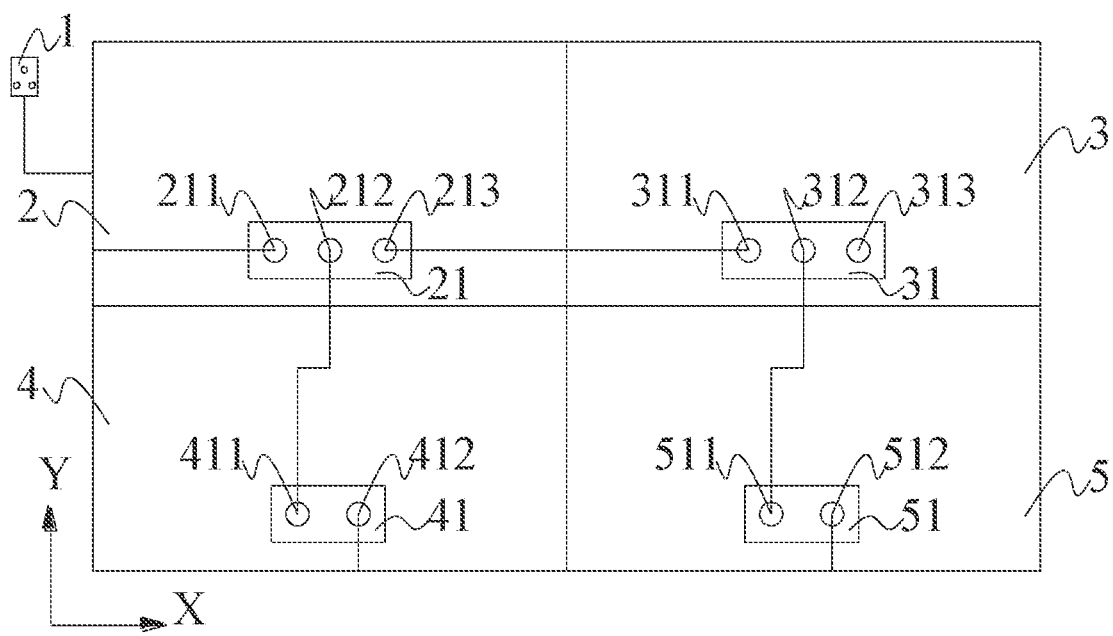
FIG. 9 is a schematic structural diagram of a seventh display panel according to an embodiment of the present disclosure.

Referring to FIG. 9, FIG. 9 is a schematic structural diagram of a seventh display panel according to an embodiment of the present disclosure. The display panel includes one power adapter 1 and four sub-display panels. A sub-display panel 2 and a sub-display panel 4 in a same column include a second power supply integrated board 21 and a first power supply integrated board 41, respectively. A sub-display panel 3 and a sub-display panel 5 in another same column include a second power supply integrated board 31 and a first power supply integrated board 51, respectively. The second power supply integrated board 21 includes a second power supply input port 211, a second power supply output port 212, and a third power supply output port 213. The second power supply integrated board 31 includes a second power supply input port 311, a second power supply output port 312, and a third power supply output port 313. The first power supply integrated board 41 includes a first power supply input port 411 and a first power supply output port 412. The first power supply integrated board 51 includes a first power supply input port 511 and a first power supply output port 512. The second power supply input port 211 is electrically connected to the power adapter 1, the second power supply output port 212 is electrically connected to the first power supply input port 411 adjacently in a next row, the third power supply output port 213 is electrically connected to the second power supply input port 311 adjacently in a next column, and the second power supply output port 312 is electrically connected to the first power supply input port 511 adjacently in the next row. Similarly, the second power supply output port 412 is electrically connected to another first power supply input port adjacently in another next row, and the third power supply output port 313 is electrically connected to another second power supply input port adjacently in another next column.

In some embodiments, the display panel includes one power adapter and at least three sub-display panels, wherein, the power adapter is electrically connected to one of the at least three sub-display panels in one row or column; wherein at least one of the at least three sub-display panels includes one first power supply integrated board, at least another one of the at least three sub-display panels includes one second power supply integrated board, and one of the at least three sub-display panels includes one third power supply integrated board; and the at least three sub-display panels in the same row or column supply electricity to the adjacent next sub-display panel by the first power supply integrated board or the second power supply integrated board of another one of the at least three sub-display panels adjacent to the one of the at least three sub-display panels including the third power supply integrated board.

Specifically, the third power supply integrated board includes one power supply input port and four power supply output ports, that is, the third power supply input port, the fourth power supply output port, the fifth power supply output port, the sixth power supply output port, and the seventh power supply output port; two of the power supply output ports opposite to each other in the third power supply integrated board are electrically connected to the second power supply input port of two second power supply integrated boards in a previous row and a next row; and another two of the power supply output ports opposite to each other in the third power supply integrated board are electrically connected to the first power supply input port of two first power supply integrated boards in a previous column and a next column.

Further, the third power supply integrated board is disposed in the one of the at least three sub-display panels that is in a center of the display panel, and the first power supply integrated board and the second power supply integrated board are disposed in other sub-display panels surrounding the third power supply integrated board; that is, the first power supply integrated board is disposed in another sub-display panels in the same row or column as the third power supply integrated board, and the second power supply integrated board is disposed in yet another sub-display panels in the same column or row as the third power supply integrated board.

In summary, the number of the first power supply integrated boards is an integral multiple of a sum of the number of the second power supply integrated boards and a number of the third power supply integrated boards. The first power supply integrated board includes the first power supply input port and the first power supply output port. The second power supply integrated board includes the second power supply input port, the second power supply output port, and the third power supply output port. The third power supply integrated board includes the third power supply input port, the fourth power supply output port, the fifth power supply output port, the sixth power supply output port, and the seventh power supply output port.

Further, in some embodiments, the third power supply input port is electrically connected to the power adapter, the fourth power supply output port is electrically connected to the second power supply input port adjacently in the previous row, the fifth power supply output port is electrically connected to the second power supply input port adjacently in the next row, the sixth power supply output port is electrically connected to the first power supply input port adjacently in the previous column, the seventh power supply output port is electrically connected to the first power supply input port adjacently in the next column, the third power supply output port in the previous row is electrically connected to the first power supply input port adjacently in the previous row and the previous column, and the second power supply output port in the previous row is electrically connected to the first power supply input port adjacently in the previous row and the next column.

Or, in some embodiments, the third power supply input port is electrically connected to the power adapter, the fourth power supply output port is electrically connected to the first power supply input port adjacently in the previous row, the fifth power supply output port is electrically connected to the first power supply input port adjacently in the next row, the sixth power supply output port is electrically connected to the second power supply input port adjacently in the previous column, the seventh power supply output port is electrically connected to the second power supply input port adjacently in the next column, the third power supply output port in the previous column is electrically connected to the first power supply input port adjacently in the previous row and the previous column, and the second power supply output port in the previous column is electrically connected to the first power supply input port adjacently in the previous column and the next row.

Figure 10:
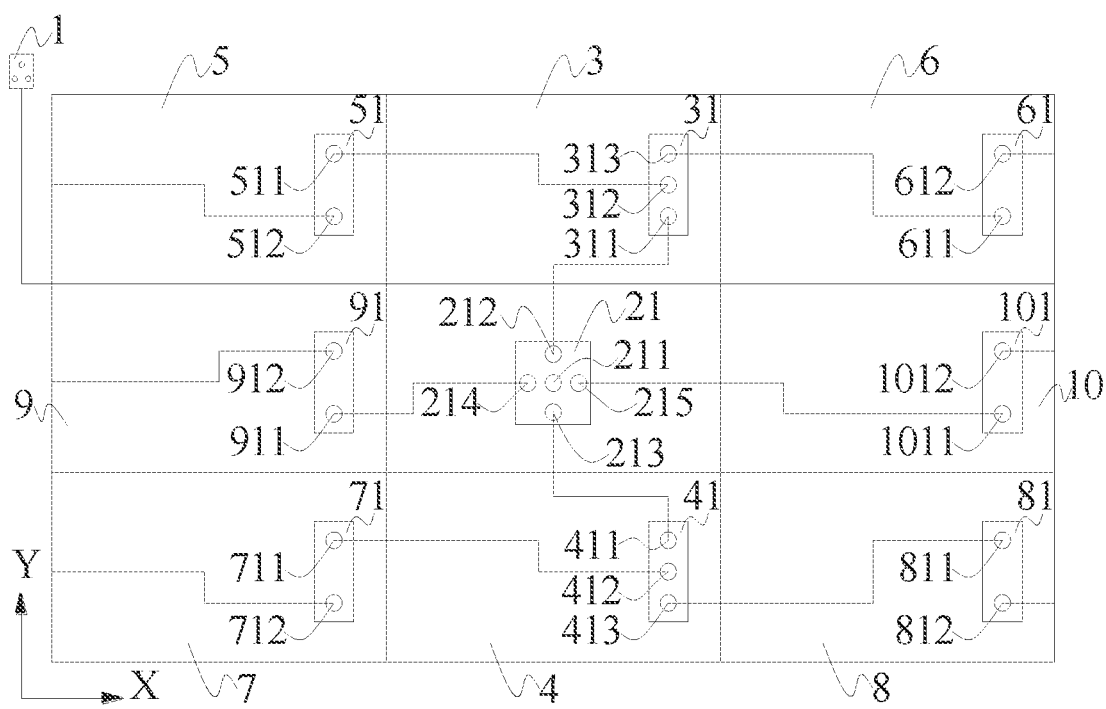
FIG. 10 is a schematic structural diagram of an eighth display panel according to an embodiment of the present disclosure.

Referring to FIG. 10, FIG. 10 is a schematic structural diagram of an eighth display panel according to an embodiment of the present disclosure. The power supply integrated boards in this display panel includes six first power supply integrated boards, two second power supply integrated boards, and one third power supply integrated board. The number of the first power supply integrated boards is the integral multiple of the sum of the number of the second power supply integrated boards and the number of the third power supply integrated boards. Each of the first power supply integrated boards includes the first power supply input port and the first power supply output port. For example, the first power supply integrated board 51 includes the first power supply input port 511 and the first power supply output port 512. The first power supply integrated board 61 includes the first power supply input port 611 and the first power supply output port 612. The first power supply integrated board 71 includes the first power supply input port 711 and the first power supply output port 712. The first power supply integrated board 81 includes the first power supply input port 811 and the first power supply output port 812. The first power supply integrated board 91 includes the first power supply input port 911 and the first power supply output port 912. The first power supply integrated board 101 includes the first power supply input port 1011 and the first power supply output port 1012. Each of the second power supply integrated boards includes the second power supply input port, the second power supply output port, and the third power supply output port. For example, the second power supply integrated board 31 includes the second power supply input port 311, the second power supply output port 313, and the third power supply output port 312. The second power supply integrated board 41 includes the second power supply input port 411, the second power supply output port 413, and the third power supply output port 412. The third power supply integrated board includes the third power supply input port, the fourth power supply output port, the fifth power supply output port, the sixth power supply output port, and the seventh power supply output port. For example, the third power supply integrated board 21 includes the third power supply input port 211, the fourth power supply output port 212, the fifth power supply output port 213, the sixth power supply output port 214, and the seventh power supply output port 215.

Further, in some embodiments, the third power supply input port 211 is electrically connected to the power adapter 1, the fourth power supply output port 212 is electrically connected to the second power supply input port 311 adjacently in the previous row, the fifth power supply output port 213 is electrically connected to the second power supply input port 411 adjacently in the next row, the sixth power supply output port 214 is electrically connected to the first power supply input port 911 adjacently in the previous column, the seventh power supply output port 215 is electrically connected to the first power supply input port 1011 adjacently in the next column, the third power supply output port 312 in the previous row is electrically connected to the first power supply input port 511 adjacently in the previous row and the previous column, and the second power supply output port 313 in the previous row is electrically connected to the first power supply input port 611 adjacently in the previous row and the next column. Similarly, the third power supply output port 412 in the next row is electrically connected to the first power supply input port 711 adjacently in the next row and the previous column, and the second power supply output port 413 in the next row is electrically connected to the first power supply input port 811 adjacently in the next row and the next column. This connecting method can allow the nine sub-display panels to share the power adapter 1. Similarly, when the power of the power adapter 1 is able to meet the rated power of each of the sub-display panels, the number of the sub-display panels may also be added along the first direction and the second direction, respectively, thereby greatly reducing the number of the power adapters 1 used, saving the costs, and being more convenient for installation and use.

Figure 11:
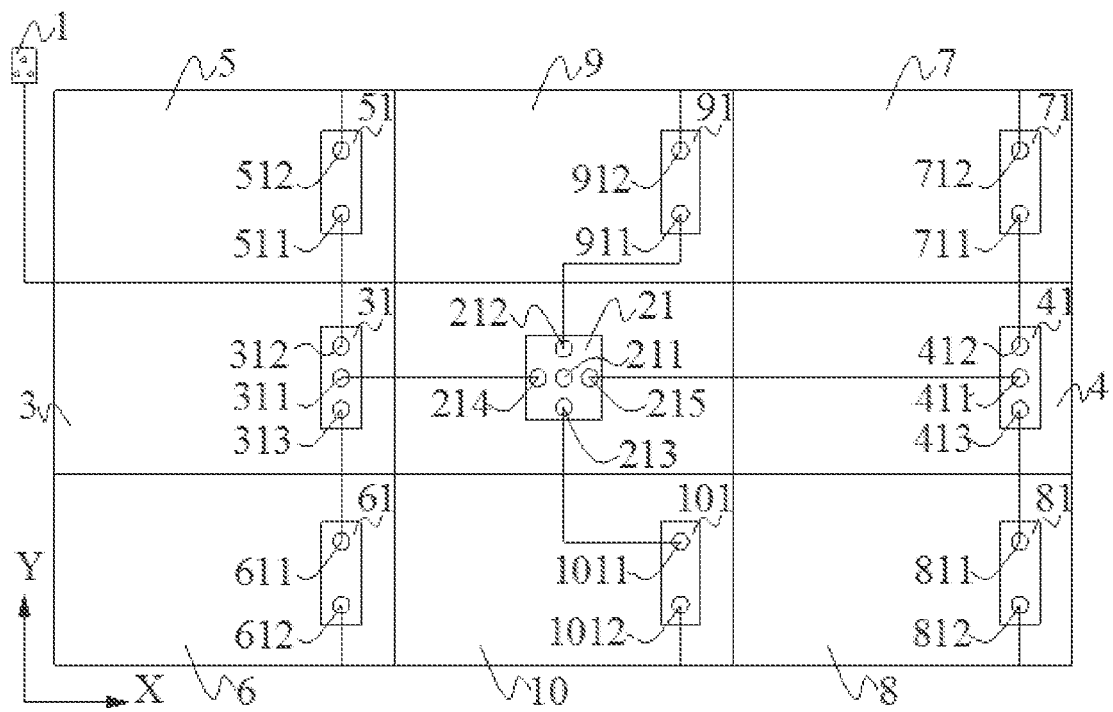
FIG. 11 is a schematic structural diagram of a ninth display panel according to an embodiment of the present disclosure.

Further, in another embodiments, referring to FIG. 11, FIG. 11 is a schematic structural diagram of a ninth display panel according to an embodiment of the present disclosure. Or, in some embodiments, the third power supply input port 211 is electrically connected to the power adapter 1, the fourth power supply output port 212 is electrically connected to the first power supply input port 911 adjacently in the previous row, the fifth power supply output port 213 is electrically connected to the first power supply input port 1011 adjacently in the next row, the sixth power supply output port 214 is electrically connected to the second power supply input port 311 adjacently in the previous column, the seventh power supply output port 215 is electrically connected to the second power supply input port 411 adjacently in the next column, the third power supply output port 312 in the previous column is electrically connected to the first power supply input port 511 adjacently in the previous row and the previous column, and the second power supply output port 313 in the previous column is electrically connected to the first power supply input port 611 adjacently in the previous column and the next row. Similarly, this connecting method can also allow the nine sub-display panels to share the power adapter 1. Similarly, when the power of the power adapter 1 is able to meet the rated power of each of the sub-display panels, the number of the sub-display panels may also be added along the first direction and the second direction, respectively, thereby greatly reducing the number of the power adapters 1 used, saving the costs, and being more convenient for installation and use.

The present disclosure further provides a display module, which includes the display panel in any one of the embodiments above.

Specifically, the display module includes the power adapters and the at least two sub-display panels; each of the at least two sub-display panels includes the power supply input port and the power supply output port electrically connected to each other; and the power supply input port of at least one of the at least two sub-display panels and the power supply output port of the adjacent sub-display panel are connected in parallel, each of the power adapters is connected to the power supply input port of the one of the at least two sub-display panels, and the number of the power adapters is less than a number of the at least two sub-display panels.

Further, each of the sub-display panels includes the power supply integrated board, and the power supply integrated board includes the power supply input port, the power supply output port, the first power supply line 111, and the second power supply line 112.

Further, each of the sub-display panels further includes the power supply wiring 11, and the first power supply line 111 and the second power supply line 112 at the power supply input port of at least one of the sub-display panels are electrically connected to the first power supply line 111 and the second power supply line 112 at the power supply output port of the adjacent sub-display panel by the power supply wiring 11, respectively.

Figure 12:
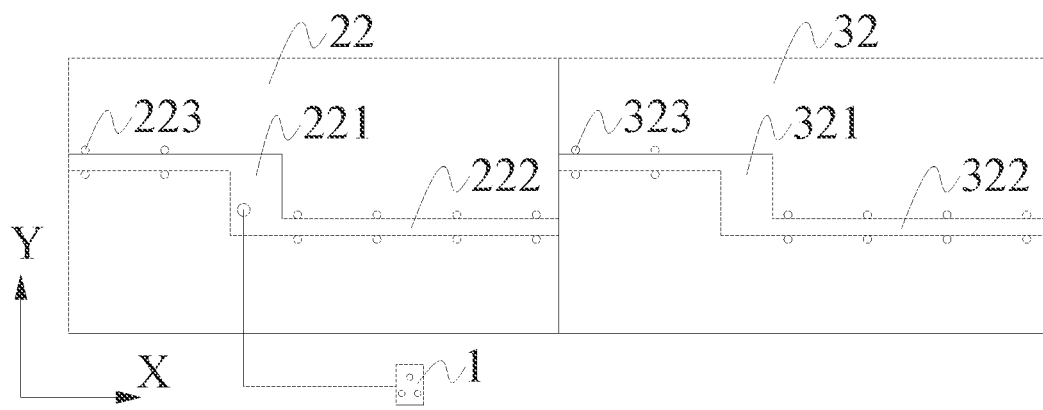
FIG. 12 is a schematic structural diagram of a back cover of a display module according to an embodiment of the present disclosure.

Further, referring to FIG. 12, FIG. 12 is a schematic structural diagram of a back cover of the display module according to an embodiment of the present disclosure. The display module further includes the back cover 22, the at least two of the sub-display panels are mounted in the back cover 22, outer sides of the back cover 22 along a length direction of the back cover 22 include a groove 221, and the power supply wiring 11 is accommodated in the groove 221.

Further, the outer sides of the back cover 22 further include a plurality of recessed parts 222 and a plurality of hooks 223, the recessed parts 222 are connected to the groove 221, and the hooks 223 are respectively disposed on both sides of the groove 221 and opposite to each other to form receiving spaces. The display module includes a plurality of module power supply input ports and a plurality of module power supply output ports, and the power adapters are electrically connected to the power supply input ports of corresponding sub-display panels by the module power supply input ports. The power supply wiring 11 is electrically connected to the power supply input port of the corresponding sub-display panels by the module power supply input ports, and the power supply wiring 11 is electrically connected to the power supply output port of the corresponding sub-display panels by the module power supply output ports. The recessed parts 222 accommodate the module power supply input ports, the module power supply output ports, terminals of the power adapters, and terminals of the power supply wiring 11. The power supply wiring 11 is accommodated in the receiving spaces.

Further, in the back cover 32 of a next display module, the outer sides of the back cover 32 further include a plurality of recessed parts 322 and a plurality of hooks 323, the recessed parts 322 are connected to a groove 321, and the hooks 323 are respectively disposed on both sides of the groove 321 and opposite to each other to form the receiving spaces.

It should be noted that in the power supply integrated boards mentioned above, the power supply input port and the power supply output port are artificially set, that is, the power supply input port and the power supply output port can be exchanged with each other. Since there is no electrical device between the power supply input port and the power supply output port and there is no influence of resistances, a connection between the power supply input port and the power supply output port is equivalent to a wire connection, so an electrical potential of the power supply input port is equal to an electrical potential of the power supply output port. Therefore, users can choose convenient ports as the power supply input port and the power supply output port according to their own needs.

Therefore, beneficial effects of the display panel and the display module provided in the present disclosure are as follows. The display panel includes the at least two sub-display panels. Each of the sub-display panels includes the power supply input port, the power supply output port, the first power supply line, and the second power supply line electrically connected to each other. A first end of the power supply input port is connected to a first end of the power supply output port by the first power supply line, and a second end of the power supply input port is connected to a second end of the power supply output port by the second power supply line. The first end and the second end of the power supply input port of at least one of the sub-display panels are electrically connected to the first end and the second end of the power supply output port of the adjacent sub-display panel. This structural design can greatly reduce the number of the power adapters used, thereby simplifying power supply wirings 11 of the splicing screens, improving safety of using the splicing screens, and saving the costs.

The display panel and the display module provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising at least one power adapter and at least two sub-display panels;
   wherein one of the at least two sub-display panels in at least one row or column is electrically connected to one of the at least one power adapter;
   each of the at least two sub-display panels comprises a power supply integrated board; and
   the one of the at least two sub-display panels supplies electricity to an adjacent next sub-display panel by the power supply integrated board; and
   the at least two sub-display panels are connected in parallel by power supply integrated boards of the at least two sub-display panels.

2. The display panel according to claim 1, wherein a number of the at least one power adapter comprised by the display panel is greater than one.

3. The display panel according to claim 2, comprising a plurality of sub-display panels arranged in a plurality of rows or columns and a plurality of power adapters electrically connected to each row or column of the plurality of rows or columns in a one-to-one manner, wherein the each row or column of the plurality of rows or columns is arranged with at least two sub-display panels, one of the at least two sub-display panels in the each row or column of the plurality of rows or columns is electrically connected to one of the plurality of power adapters; and
   wherein each of the plurality of sub-display panels comprises a first power supply integrated board, and one of the at least two sub-display panels supply electricity to an adjacent next sub-display panel by the first power supply integrated board of the one of the at least two sub-display panels in a same row or column.

4. The display panel according to claim 3, wherein the first power supply integrated board comprises a first power supply input port and a first power supply output port, the first power supply input port is electrically connected to a previous sub-display panel in an adjacent row or column, and the first power supply output port is electrically connected to a next sub-display panel in another adjacent row or column.

5. The display panel according to claim 1, wherein a number of the at least one power adapter comprised by the display panel is one.

6. The display panel according to claim 5, comprising the one power adapter and at least four sub-display panels arranged in a plurality of rows or columns, wherein the one power adapter is electrically connected to one of the at least four sub-display panels;

wherein at least one of the at least four sub-display panels comprises a first power supply integrated board, at least another one of the at least four sub-display panels comprises a second power supply integrated board with a different number of power supply output ports than the first power supply integrated board, and one of the at least four sub-display panels supply electricity to an adjacent next sub-display panel by the first power supply integrated board or the second power supply integrated board of the one of the at least four sub-display panels in a same row or column.

7. The display panel according to claim 6, wherein each of sub-display panels in one row or column of the plurality of rows or columns directly connected to the one power adapter comprises the second power supply integrated board, the first power supply integrated board comprises a first power supply input port and a first power supply output port, and the second power supply integrated board comprises a second power supply input port, a second power supply output port, and a third power supply output port;

the second power supply input port of the second power supply integrated board in the one of the sub-display panels in the one row or column is electrically connected to the one power adapter, and the second power supply output port of the second power supply integrated board in the one of the sub-display panels is electrically connected to the first power supply input port of the first power supply integrated board of an adjacent one of the sub-display panels in a row or column adjacent to the one row or column; and the third power supply output port of the second power supply integrated board in the one of the sub-display panels is electrically connected to the second power supply input port of the second power supply integrated board of an adjacent one of the sub-display panels in the one column or row.

8. The display panel according to claim 5, comprising the one power adapter and a plurality of sub-display panels arranged in a plurality of rows or columns, wherein each row or column of the plurality of rows or columns is arranged with at least three sub-display panels, and the one power adapter is electrically connected to one of the plurality of sub-display panels;

wherein at least one of the plurality of sub-display panels comprises a first power supply integrated board, at least another one of the plurality of sub-display panels comprises a second power supply integrated board, one of the plurality of sub-display panels comprises a third power supply integrated board, and the first power supply integrated board, the second power supply integrated board, and the third power supply integrated board comprises different numbers of power supply output ports from each other; and the one of the plurality of sub-display panels with the third power supply integrated board supplies electricity to another sub-display panel adjacent to the one of the plurality of sub-display panels with the third power supply integrated board in a same row or column, and the other sub-display panel adjacent to the one of the plurality of sub-display panels with the third power supply integrated board comprise the first power supply integrated board or the second power supply integrated board, and supplies electricity to an adjacent next sub-display panel by the first power supply integrated board or the second power supply integrated board.

9. The display panel according to claim 8, wherein the first power supply integrated board comprises a first power supply input port and a first power supply output port, the second power supply integrated board comprises a second power supply input port, a second power supply output port, and a third power supply output port, and the third power supply integrated board comprises a third power supply input port, a fourth power supply output port, a fifth power supply output port, a sixth power supply output port, and a seventh power supply output port;

the third power supply input port of the third power supply integrated board is electrically connected to the power adapter, the fourth power supply output port and the fifth power supply output port opposite to each other in the third power supply integrated board are electrically connected to the second power supply input ports of two second power supply integrated boards in a previous row and a next row; and the sixth power supply output port and the seventh power supply output port opposite to each other in the third power supply integrated board are electrically connected to the first power supply input ports of two first power supply integrated boards in a previous column and a next column.

10. The display panel according to claim 8, wherein the third power supply integrated board is disposed in the one of the plurality of sub-display panels that is in a center of the display panel, and the first power supply integrated board and the second power supply integrated board are disposed in other sub-display panels surrounding the third power supply integrated board.

11. A display module, comprising a display panel, wherein the display panel comprises at least one power adapter and at least two sub-display panels;

wherein one of the at least two sub-display panels in at least one row or column is electrically connected to one of the at least one power adapter;

each of the at least two sub-display panels comprises a power supply integrated board; and the one of the at least two sub-display panels supplies electricity to an adjacent next sub-display panel by the power supply integrated board, and the at least two sub-display panels are connected in parallel by power supply integrated boards of the at least two sub-display panels.

12. The display module according to claim 11, wherein a number of the at least one power adapter comprised by the display panel is greater than one.

13. The display module according to claim 12, comprising a plurality of sub-display panels arranged in a plurality of rows or columns and a plurality of power adapters electrically connected to each row or column of the plurality of rows or columns in a one-to-one manner, wherein the each row or column of the plurality of rows or columns is arranged with at least two sub-display panels, one of the at least two sub-display panels in the each row or column of the plurality of rows or columns is electrically connected to one of the plurality of power adapters; and wherein each of the plurality of sub-display panels comprises a first power supply integrated board, and one of the at least two sub-display panels supply electricity to an adjacent next sub-display panel by the first power supply integrated board of the one of the at least two sub-display panels in a same row or column.

14. The display module according to claim 13, wherein the first power supply integrated board comprises a first power supply input port and a first power supply output port, the first power supply input port is electrically connected to a previous sub-display panel in an adjacent row or column, and the first power supply output port is electrically connected to a next sub-display panel in another adjacent row or column.

15. The display module according to claim 11, wherein a number of the at least one power adapter comprised by the display panel is one.

16. The display module according to claim 15, comprising the one power adapter and at least four sub-display panels arranged in a plurality of rows or columns, wherein the one power adapter is electrically connected to one of the at least four sub-display panels;

wherein at least one of the at least four sub-display panels comprises a first power supply integrated board, at least another one of the at least four sub-display panels comprises a second power supply integrated board with a different number of power supply output ports than the first power supply integrated board, and one of the at least four sub-display panels supply electricity to an adjacent next sub-display panel by the first power supply integrated board or the second power supply integrated board of the one of the at least four sub-display panels in a same row or column.

17. The display module according to claim 16, wherein each of sub-display panels in one row or column of the plurality of rows or columns directly connected to the one power adapter comprises the second power supply integrated board, the first power supply integrated board comprises a first power supply input port and a first power supply output port, and the second power supply integrated board comprises a second power supply input port, a second power supply output port, and a third power supply output port;

the second power supply input port of the second power supply integrated board in the one of the sub-display panels in the one row or column is electrically connected to the one power adapter, and the second power supply output port of the second power supply integrated board in the one of the sub-display panels is electrically connected to the first power supply input port of the first power supply integrated board of an adjacent one of the sub-display panels in a same row or column adjacent to the one row or column; and the third power supply output port of the second power supply integrated board in the one of the sub-display panels is electrically connected to the second power supply input port of the second power supply integrated board of an adjacent one of the sub-display panels adjacently in the one column or row.

18. The display module according to claim 15, comprising the one power adapter and a plurality of sub-display panels arranged in a plurality of rows or columns, wherein each row or column of the plurality of rows or columns is arranged with at least three sub-display panels, and the one power adapter is electrically connected to one of the plurality of sub-display panels;

wherein at least one of the plurality of sub-display panels comprises a first power supply integrated board, at least another one of the plurality of sub-display panels comprises a second power supply integrated board, one of the plurality of sub-display panels comprises a third power supply integrated board, and the first power supply integrated board, the second power supply integrated board, and the third power supply integrated board comprises different numbers of power supply output ports from each other; and the one of the plurality of sub-display panels with the third power supply integrated board supplies electricity to another sub-display panel adjacent to the one of the plurality of sub-display panels with the third power supply integrated board in a same row or column, and the other sub-display panel adjacent to the one of the plurality of sub-display panels with the third power supply integrated board comprise the first power supply integrated board or the second power supply integrated board, and supplies electricity to an adjacent next sub-display panel by the first power supply integrated board or the second power supply integrated board.

19. The display module according to claim 18, wherein the first power supply integrated board comprises a first power supply input port and a first power supply output port, the second power supply integrated board comprises a second power supply input port, a second power supply output port, and a third power supply output port, and the third power supply integrated board comprises a third power supply input port, a fourth power supply output port, a fifth power supply output port, a sixth power supply output port, and a seventh power supply output port;

the third power supply input port of the third power supply integrated board is electrically connected to the power adapter, the fourth power supply output port and the fifth power supply output port opposite to each other in the third power supply integrated board are electrically connected to the second power supply input ports of two second power supply integrated boards in a previous row and a next row; and the sixth power supply output port and the seventh power supply output port opposite to each other in the third power supply integrated board are electrically connected to the first power supply input ports of two first power supply integrated boards in a previous column and a next column.

20. The display module according to claim 18, wherein the third power supply integrated board is disposed in the one of the plurality of sub-display panels that is in a center of the display panel, and the first power supply integrated board and the second power supply integrated board are disposed in other sub-display panels surrounding the third power supply integrated board.

* * * * *